United States Patent [19]

Jolly

[11] 4,421,576

[45] Dec. 20, 1983

[54] METHOD FOR FORMING AN EPITAXIAL COMPOUND SEMICONDUCTOR LAYER ON A SEMI-INSULATING SUBSTRATE

[75] Inventor: Stuart T. Jolly, Yardley, Pa.

[73] Assignee: RCA Corporation, New York, N.Y.

[21] Appl. No.: 302,196

[22] Filed: Sep. 14, 1981

[51] Int. Cl.³ .................... H01L 21/20; H01L 21/306
[52] U.S. Cl. .................... 148/175; 148/174;
      156/612; 156/613; 156/614; 156/657; 156/662
[58] Field of Search .............. 148/174, 175; 156/612,
      156/613, 614, 657, 662

[56] References Cited

U.S. PATENT DOCUMENTS

| | | | |
|---|---|---|---|
| 3,208,888 | 9/1965 | Ziegler et al. | 148/175 |
| 3,224,911 | 12/1965 | Williams et al. | 148/175 |
| 3,243,323 | 3/1966 | Corrigan et al. | 148/175 |
| 3,345,222 | 10/1967 | Nomura et al. | 148/175 |
| 3,392,066 | 7/1968 | McDermott et al. | 148/175 |
| 3,393,103 | 7/1968 | Hellbardt et al. | 148/175 |
| 3,480,491 | 11/1969 | Reisman et al. | 156/17 |
| 3,511,727 | 5/1970 | Hays | 156/17 |
| 3,522,118 | 7/1970 | Taylor et al. | 156/17 |
| 3,600,241 | 8/1971 | Doo et al. | 148/175 |
| 3,729,348 | 4/1973 | Saul | 148/1.5 X |
| 3,762,945 | 10/1973 | DiLorenzo | 148/175 X |
| 3,802,967 | 4/1974 | Ladany et al. | 148/175 X |
| 3,808,072 | 4/1974 | DiLorenzo | 156/17 |
| 3,855,024 | 12/1974 | Lim | 156/17 |
| 3,900,363 | 8/1975 | Teraoka et al. | 156/612 |
| 3,983,510 | 9/1976 | Hayashi et al. | 148/175 X |
| 4,000,020 | 12/1976 | Gartman | 148/175 |
| 4,154,663 | 5/1979 | Adams | 204/129 |
| 4,253,887 | 3/1981 | Jolly | 148/175 |

OTHER PUBLICATIONS

Cho et al., "GaAs MESFET . . . Epitaxy (MBE)" Appl. Phys. Letters, vol. 28, No. 1, Jan. 1, 1976, pp. 30–31.
DiLorenzo, J. V., "Analysis of Impurity . . . GaAs" J. Electrochem. Soc., vol. 118, No. 10, Oct. 1971, pp. 1645–1649.
Statz, H., "Fabricating Field Effect Transistors" I.B.M. Tech. Discl. Bull., vol. 11, No. 4, Sep. 1968, p. 397.
Vapor–Phase Growth of Several III–V Compound Semiconductors, J. J. Tietjen et al., Solid State Technology, Oct. 1972, pp. 42–49.

Primary Examiner—W. G. Saba
Attorney, Agent, or Firm—Birgit E. Morris; Donald S. Cohen; Kenneth R. Glick

[57] ABSTRACT

A first compound semiconductor layer is epitaxially formed on a surface of a semi-insulating substrate. The first semiconductor layer is then removed and a second compound semiconductor layer is epitaxially formed on the substrate surface which is now exposed.

7 Claims, 4 Drawing Figures

METHOD FOR FORMING AN EPITAXIAL COMPOUND SEMICONDUCTOR LAYER ON A SEMI-INSULATING SUBSTRATE

BACKGROUND OF THE INVENTION

The present invention relates to a method for forming a compound semiconductor layer of relatively high purity on a semi-insulating substrate.

Compound semiconductor materials, such as III-V, II-VI, and ternary and quaternary compounds, are frequently used in electronic devices which are to be operated at high frequencies. In part, this is because such materials intrinsically provide greater electron mobility than silicon or germanium. The devices are typically structured with an active monocrystalline compound semiconductor layer disposed on a substrate of semi-insulating material. A highly resistive substrate material is chosen because such materials provide electrical isolation for the device or multiplicity of devices generated thereon and because they provide good dielectric mediums for devices which are to be operated at radio or microwave frequencies.

Gallium arsenide is a frequently used substrate material because, among other things, a high quality epitaxial active layer can readily be nucleated thereon. So as to insure their semi-insulating nature, GaAs substrates are typically doped with chromium and/or oxygen. Additionally, semi-insulating GaAs substrates often contain other impurity atoms which, for example, might have been introduced during substrate fabrication.

The active semiconductor layer is typically formed by epitaxial growth on a planar surface of the substrate and it is well-known that the physical condition of the substrate surface greatly affects the quality of the epitaxial layer. In order to achieve a clean, smooth and relatively strain free surface, a variety of mechanical polishing techniques as well as liquid and gaseous etching techniques are commonly employed. For example, alternative conventional polishing techniques are described in U.S. Pat. No. 3,855,024, METHOD OF VAPOR PHASE POLISHING A SURFACE OF A SEMICONDUCTOR, M. Lim, Dec. 17, 1974, and in U.S. Pat. No. 3,808,072, IN SITU ETCHING OF GALLIUM ARSENIDE DURING VAPOR PHASE GROWTH OF EPITAXIAL GALLIUM ARSENIDE, J. V. DiLorenzo, Apr. 30, 1974.

However, I have discovered that even when a high quality semi-insulating substrate surface is provided, a subsequently grown epitaxial film is invariably contaminated. This contamination has been observed despite close processing controls during the epitaxial growth. In an effort to reduce the level of this contamination, the present invention was discovered.

SUMMARY OF THE INVENTION

A relatively thick compound semiconductor layer is epitaxially formed on a planar surface of a substrate. The thick epitaxial layer is then removed and a second epitaxial layer is formed on that area of the surface from which the first epitaxial layer was removed.

DETAILED DESCRIPTION

Figure 1:
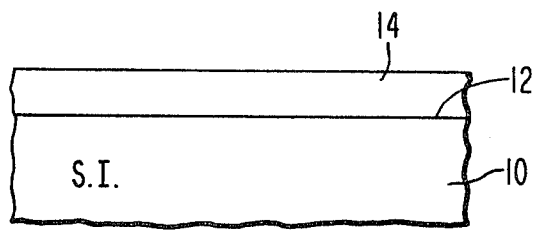
FIGS. 1-3 illustrate the process sequence of the present invention.
Figure 2:

As illustrated in FIG. 1, the starting point for the method of the present invention is a semi-insulating substrate 10 having a substantially planar surface 12. The material of the substrate 10 might be any of the commonly employed binary, ternary or quaternary compound semiconductors used in semiconductor device fabrication. The substrate 10 should be monocrystalline so as to provide a good basis for nucleating an epitaxial layer and it should be doped with a material such as chromium, iron, or oxygen so as to insure that it will be semi-insulating. In the preferred embodiment the substrate 10 is chromium-doped-GaAs having a resistivity of approximately $10^{17}$ ohm-cm.

The substrate 10 has a substantially planar surface 12 which will serve as the site for nucleating an epitaxial semiconductor layer 14. The surface 12 can be prepared for epitaxial growth using a combination of conventional mechanical polishing and liquid or gas etching techniques. The semiconductor layer 14 can then be deposited using basic vapor phase epitaxy techniques as described, for example, in VAPOR PHASE GROWTH OF SEVERAL III-V COMPOUND SEMICONDUCTORS, J. J. Tietjen et al, Solid State Technology, Vol. 15, No. 10, pp. 42-49, October 1972. In these vapor phase epitaxy techniques, the substrate 10 is located in a reactor vessel and a gaseous mixture which includes the elements to be deposited is passed over the substrate 10. Within the reactor the gaseous mixture is heated to a temperature at which the gas is decomposed and the desired elements combine and deposit on the substrate surface 12.

In the preferred embodiment of the present invention the epitaxial layer 14 is gallium arsenide. The gallium-containing portion of the gaseous mixture can be gallium chloride, obtained by passing hydrogen chloride over gallium using hydrogen as a carrier gas. The arsenic-containing portion of the gaseous mixture can be arsine, admitted to the reactor in gaseous form and also carried by hydrogen gas. A typical deposition temperature is approximately 700° C. and a typical growth rate is approximately 10-20 $\mu$m/hr. In the preferred embodiment, the thickness of the epitaxial film 14, although not critical, is greater than approximately 2 microns, and is preferably in the 3-5 micron range.

In the second step of the method of the present invention the epitaxial layer 14 is removed from the substrate 10 so as to yield surface 16 on substrate 10. This newly exposed substrate surface 16 may or may not be identical to the original substrate surface 12. This is because it is important to remove the entire epitaxial layer 14 during this processing step, and to insure the complete removal, a portion of the original substrate 10 can be removed as well. Preferably, the removal of the epitaxial layer 14 is performed with the substrate in situ in the reactor. This can be performed, for example, by withdrawing the substrate to a portion of the reactor downstream of the reactor exhaust, exhausting the gallium chloride and arsine deposition gases, etching the reactor walls clean, relocating the substrate in the deposition portion of the chamber, and etching the epitaxial layer 14 by passing hydrogen chloride gas over the surface thereof.

Figure 3:
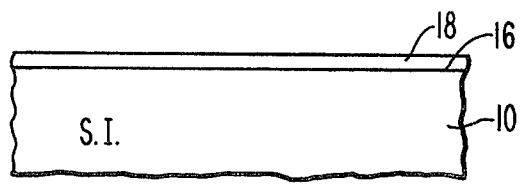

An active semiconductor layer 18 is then epitaxially grown on surface 16 of the substrate 10 as illustrated in FIG. 3. The active layer 18 can be grown in a manner similar to that used for the formation of layer 14 although typically the active layer 18 will not be as thick. A typical active layer 18 thickness, when fabricating a device such as a field effect transistor on the surface thereof, is in the 0.1 to 1.0 micron range.

The active layer 18 obtained by this process, hereinafter termed the grow-etch-grow (GEG) process, exhibits greater mobility than an equivalent active layer grown directly on the surface 12 of a semi-insulating substrate. Tabulated below is test data which illustrates the effectiveness of this process.

| Wafer | Active Layer Thickness ($\mu$m) | Concentration $N_D - N_A$ (cm$^{-3}$) | Compensation $K\left(\dfrac{N_D + N_A}{N_D - N_A}\right)$ (at 27° C.) |
|---|---|---|---|
| A | 0.2 | $8.4 \times 10^{16}$ | 1.8 |
| B(GEG) | 0.2 | $9.8 \times 10^{16}$ | 1.4 |
| C | 0.2 | $1.0 \times 10^{17}$ | 1.5 |
| D(GEG) | 0.2 | $1.7 \times 10^{17}$ | 1.3 |
| E(GEG) | 0.2 | $1.2 \times 10^{17}$ | 1.1 |

Five wafers were evaluated, three being fabricated by the GEG process and two being fabricated conventionally. The active layer thickness on each substrate was 0.2 microns and each substrate was doped with donor type impurities so as to yield net donor concentration ($N_D - N_A$) values ranging from $8.4 \times 10^{16}$ to $1.7 \times 10^{17}$ cm$^{-3}$.

It is a known physical principle that for a given (donor or acceptor) carrier concentration a theoretically ideal (electron or hole) carrier mobility exists. For the purpose of comparing the actual carrier mobility of a material with its ideal carrier mobility, a parameter termed compensation, K, has been developed, wherein $K = (N_D + N_A)/(N_D - N_A)$. In addition to facilitating comparison between actual and ideal mobility, the compensation factor K serves to normalize comparisons among materials having different carrier concentrations. The closer the compensation factor K is to unity, the closer the carrier mobility in a given material is to its ideal value. Observation of the above data thus shows improved carrier mobility in active layers grown on GEG wafers.

Figure 4:
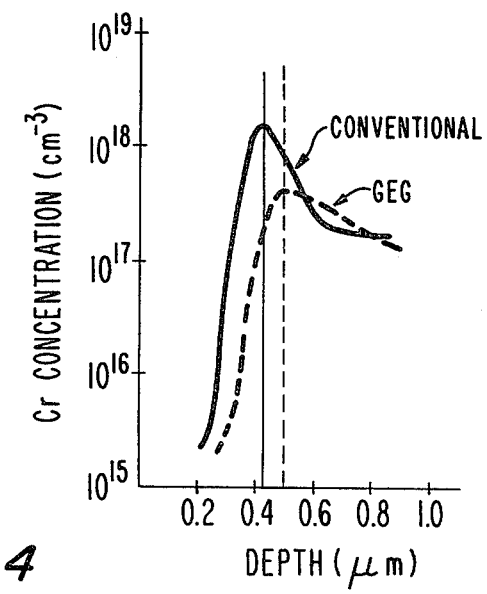
FIG. 4 is a graphic representation of chromium concentration as a function of depth from the surface of the active layer, through the active layer/substrate interface and into the substrate. The solid line represents the profile in a conventionally processed structure and the broken line represents the profile in the structure produced in accordance with the present invention.

Although the GEG process produces a marked improvement in the carrier mobility in active layers so formed, a comprehensive explanation of the phenomenon cannot presently be rendered. However, in an effort to at least partially explain the enhanced electron mobility observed in the N type active layer 18 grown in the preferred embodiment, FIG. 4 is presented. FIG. 4 illustrates chromium distribution as a function of depth from the external surface of an active layer on a semi-insulating substrate. The solid line curve represents a conventionally processed wafer and the broken line curve represents a wafer processed by the GEG technique. In both cases, peak chromium concentration occurs at or near the active layer/substrate interface, represented by the solid vertical line for the conventional structure and by the broken vertical line of the GEG structure. The displacement between the two vertical lines occurs because in the samples measured there was a difference in the active layer thickness.

As illustrated, at the active layer/substrate interface, chromium concentration in the conventionally grown structure is approximately $2 \times 10^{18}$ cm$^{-3}$, whereas in the GEG structure the chromium concentration is approximately $4 \times 10^{17}$ cm$^{-3}$. The GEG-processed wafer exhibits a factor of five reduction in chromium concentration compared to the conventionally processed wafer. Although the specific reason for the improved mobility in the GEG wafer is not known, it is likely that during the GEG process, undesirable impurities other than chromium are also gettered during the growth of the first epitaxial layer 14. For example, elements such as Mn, Cu and O might also diffuse from the substrate 10 to the epitaxial layer 14 through the interface 12, allowing a higher purity epitaxial layer 18 to subsequently be grown.

The enhanced mobility exhibited in structures fabricated by the GEG process is a particularly useful factor when fabricating a device which is to be used at high frequency. For example, when a binary, ternary or quaternary compound semiconductor is used in a device such as a microwave FET or a gigabit-rate digital device, the present invention provides a technique for improving electron mobility and hence device performance.

What is claimed is:
1. A method for forming a III–V type compound semiconductor film in a vapor phase deposition system, comprising:
   epitaxially forming a first III–V type compound semiconductor layer on a surface of a substrate, which is doped so as to be semi-insulating;
   completely removing said layer; and
   epitaxially forming a second III–V type compound semiconductor layer on said surface.
2. A method in accordance with claim 1, wherein the substrate is a monocrystalline compound semiconductor.
3. A method in accordance with claim 1, comprising:
   forming the first layer from a gaseous mixture comprising gallium and arsenic.
4. A method in accordance with claim 1, comprising:
   gas etching said first layer.
5. A method in accordance with claim 1, further comprising:
   forming said second layer from a gaseous mixture which comprises gallium and arsenic.
6. A method in accordance with claim 5, further comprising:
   providing an N type dopant in said gaseous mixture.
7. A method in accordance with claim 2, wherein said substrate is GaAs doped with a material selected from the group consisting of chromium and oxygen.

* * * * *